(12) United States Patent
Wang (10) Patent No.: US 9,972,602 B2
(45) Date of Patent: May 15, 2018

(54) METHOD AND APPARATUS FOR INTERCONNECTING STACKED DIES USING METAL POSTS

(71) Applicant: Marvell World Trade Ltd., St. Michael (BB)

(72) Inventor: Long-Ching Wang, Cupertino, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days. days.

(21) Appl. No.: 15/047,426

(22) Filed: Feb. 18, 2016

(65) Prior Publication Data

US 2016/0247784 A1 Aug. 25, 2016

Related U.S. Application Data

(60) Provisional application No. 62/119,579, filed on Feb. 23, 2015.

(51) Int. Cl.
*H01L 25/065* (2006.01)
*H01L 25/00* (2006.01)
(Continued)

(52) U.S. Cl.
CPC ......... *H01L 25/0657* (2013.01); *H01L 24/19* (2013.01); *H01L 24/24* (2013.01); *H01L 24/94* (2013.01); *H01L 24/97* (2013.01); *H01L 25/50* (2013.01); *H01L 21/561* (2013.01); *H01L 23/3114* (2013.01); *H01L 24/32* (2013.01); *H01L 24/73* (2013.01); *H01L 24/92* (2013.01); *H01L 2224/04105* (2013.01); *H01L 2224/12105* (2013.01); *H01L 2224/32145* (2013.01); *H01L 2224/73217* (2013.01); *H01L 2224/73267* (2013.01); *H01L 2224/92244* (2013.01); *H01L 2224/94* (2013.01); *H01L 2224/97* (2013.01); *H01L 2225/06568* (2013.01);
(Continued)

(58) Field of Classification Search
CPC ..... H01L 25/0657; H01L 24/19; H01L 24/24; H01L 24/94; H01L 24/97; H01L 25/50; H01L 24/92; H01L 2224/97; H01L 2224/94; H01L 23/3114; H01L 2924/18162; H01L 24/32; H01L 24/73; H01L 21/561
USPC ......................................................... 257/737
See application file for complete search history.

(56) References Cited

U.S. PATENT DOCUMENTS

2015/0145116 A1* 5/2015 Uzoh ...................... H01L 24/10
257/712

FOREIGN PATENT DOCUMENTS

SG    WO 2009022991 A1 *   2/2009      H01L 21/568
WO    WO2009022991 A1    2/2009

* cited by examiner

*Primary Examiner* — Adam S Bowen (57) ABSTRACT

Embodiments include a semiconductor package comprising a first die having (i) a first side and (ii) a second side, wherein the first die comprises a first plurality of bond pads formed on the first side of the first die; a second die having (i) a first side and (ii) a second side, wherein the second die comprises a second plurality of bond pads formed on the first side of the second die, wherein the second die is stacked on the first die; a first plurality of metal posts formed on the first plurality of bond pads; a second plurality of metal posts formed on the second plurality of bond pads; and a redistribution layer configured to electrically couple (i) a first metal post of the first plurality of metal posts and (ii) a second metal post of the second plurality of metal posts.

8 Claims, 11 Drawing Sheets

(51) Int. Cl.
  *H01L 23/00* (2006.01)
  *H01L 23/31* (2006.01)
  *H01L 21/56* (2006.01)
(52) U.S. Cl.
  CPC ............... *H01L 2225/06586* (2013.01); *H01L 2225/1035* (2013.01); *H01L 2225/1058* (2013.01); *H01L 2924/1431* (2013.01); *H01L 2924/1434* (2013.01); *H01L 2924/18162* (2013.01)

METHOD AND APPARATUS FOR INTERCONNECTING STACKED DIES USING METAL POSTS

CROSS REFERENCE TO RELATED APPLICATIONS

This disclosure claims priority to U.S. Provisional Patent Application No. 62/119,579, filed on Feb. 23, 2015, which is incorporated herein by reference in its entirety.

TECHNICAL FIELD

Embodiments of the present disclosure relate to stacking a die on another die, and in particular to interconnecting stacked dies via metal posts.

BACKGROUND

Integrated circuit devices are formed on dies or chips that continue to scale in size to smaller dimensions. The shrinking dimensions of the dies and semiconductor packages are challenging conventional substrate fabrication and/or package assembly technologies that are currently used to route electrical signals to or from the dies. In an example, a semiconductor package includes a first semiconductor die stacked on top of a second semiconductor die. It is challenging to route signals between the two semiconductor dies, e.g., because of the stacking of the two semiconductor dies.

SUMMARY

In various embodiments, the present disclosure provides a semiconductor package comprising a first die having (i) a first side and (ii) a second side disposed opposite the first side of the first die, wherein the first die comprises a first plurality of bond pads formed on the first side of the first die; a second die having (i) a first side and (ii) a second side disposed opposite the first side of the second die, wherein the second die comprises a second plurality of bond pads formed on the first side of the second die, wherein the second die is stacked on the first die such that the second side of the second die is attached to the first side of the first die; a first plurality of metal posts, wherein each of the first plurality of metal posts is formed on a corresponding one of the first plurality of bond pads formed on the first side of the first die; a second plurality of metal posts, wherein each of the second plurality of metal posts is formed on a corresponding one of the second plurality of bond pads formed on the first side of the second die; and a redistribution layer configured to electrically couple (i) a first metal post of the first plurality of metal posts and (ii) a second metal post of the second plurality of metal posts.

In various embodiments, the present disclosure also provides a method of forming a semiconductor package comprising forming a first die, the first die comprising (i) a first side and (ii) a second side disposed opposite the first side of the first die; forming a first plurality of bond pads on the first side of the first die; forming a second die, the second die comprising (i) a first side and (ii) a second side disposed opposite the first side of the second die; forming a second plurality of bond pads on the first side of the second die; forming a first plurality of metal posts, wherein each of the first plurality of metal posts is formed on a corresponding one of the first plurality of bond pads formed on the first side of the first die; forming a second plurality of metal posts, wherein each of the second plurality of metal posts is formed on a corresponding one of the second plurality of bond pads formed on the first side of the second die; subsequent to forming the first plurality of metal posts and the second plurality of metal posts, stacking the second die on the first die such that the second side of the second die is attached to the first side of the first die; and forming a redistribution layer that electrically couples (i) a first metal post of the first plurality of metal posts and (ii) a second metal post of the second plurality of metal posts.

In various embodiments, the present disclosure also provides a semiconductor package comprising a first die having (i) a first side and (ii) a second side disposed opposite the first side of the first die, wherein the first die comprises a first bond pad formed on the first side of the first die; a second die having (i) a first side and (ii) a second side disposed opposite the first side of the second die, wherein the second die comprises a second bond pad formed on the first side of the second die, wherein the second die is stacked on the first die such that the second side of the second die faces the first side of the first die; a first redistribution layer formed on the first side of the first die, wherein the first redistribution layer comprises (i) a first end attached to the first bond pad, and (ii) a second end that is opposite to the first end; a first metal post formed on the second end of the first redistribution layer; a second metal post formed on the second bond pad that is formed on the first side of the second die; and a second redistribution layer configured to electrically couple (i) the first metal post and (ii) the second metal post.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Various embodiments are illustrated by way of example and not by way of limitation in the figures of the accompanying drawings.

FIGS. 1A-9A illustrate various operations associated with forming a semiconductor package assembly comprising a first die stacked on a second die, wherein the first die and the second die are interconnected via metal posts.

FIGS. 10A-14 illustrate formation a semiconductor package assembly comprising a first die stacked on a central section of an active surface of the second die, where second the die comprises bond pads disposed in the central section of the active surface of the second die.

DETAILED DESCRIPTION

Figure 1A:
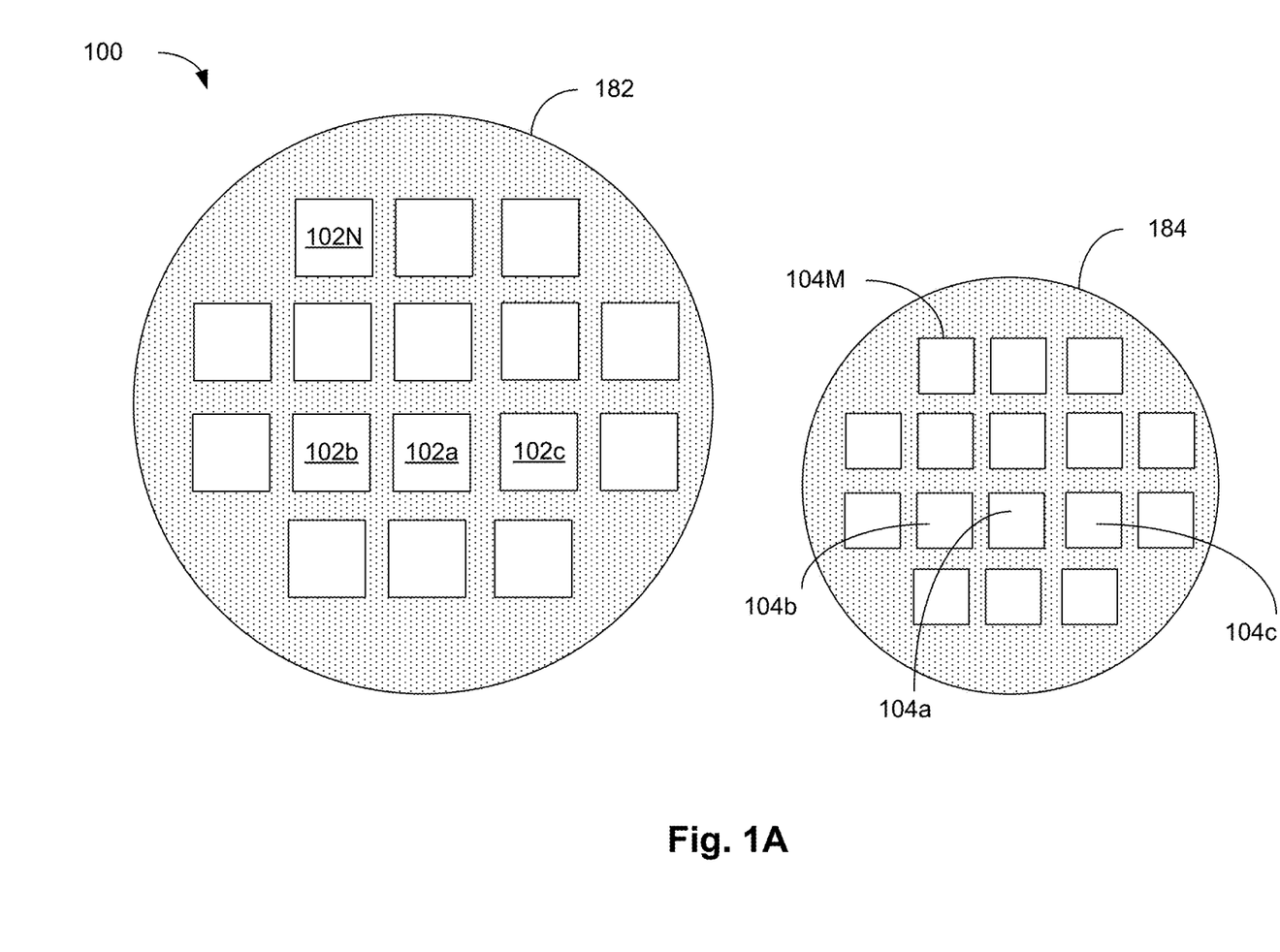

FIGS. 1A-9A illustrate various operations associated with forming a semiconductor package assembly comprising a die 104a stacked on another die 102a, wherein the dies 102a, 104a are interconnected via metal posts. Referring to FIG. 1A, this figure illustrates an arrangement 100 comprising two semiconductor wafers 182 and 184. Each of the wafers 182, 184, for example, serves as a substrate on which a corresponding plurality of semiconductor dies (henceforth referred to as "dies") is formed. For example, a plurality of dies 102a, 102b, 102c, . . . , 102N is formed on the wafer 182, and a plurality of dies 104a, 104b, 104c, . . . , 102M is formed on the wafer 184. The wafers 182, 184 and the dies thereon are formed using any appropriate technique(s) for forming wafers and dies. Although FIG. 1A illustrates an example number and arrangement of the dies on the wafers 182, 184, the wafers 182, 184 can include any other number and/or arrangement of dies formed thereon.

Figure 1B:
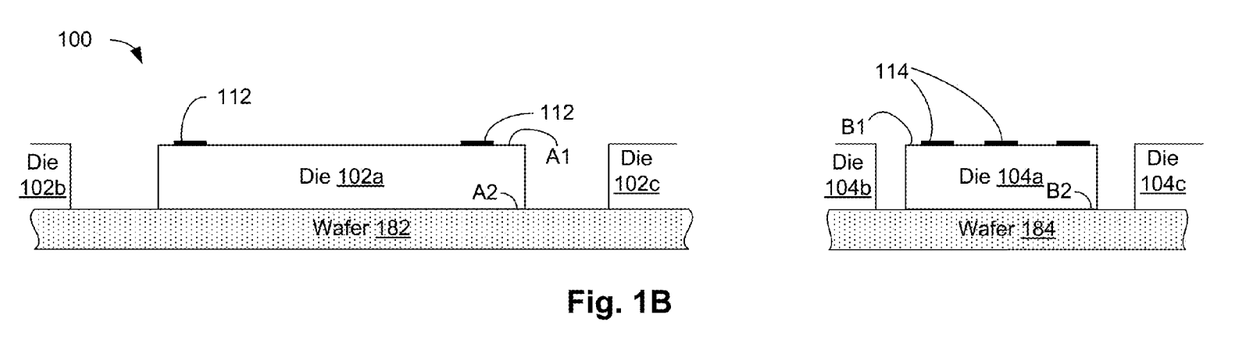
Figure 1C:
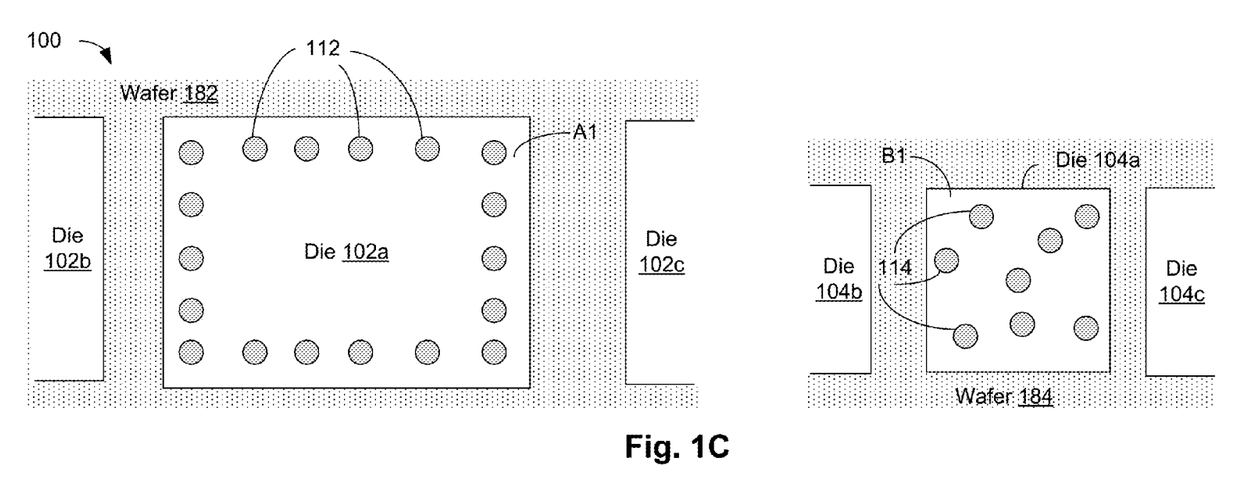

FIG. 1B illustrates a cross sectional view of the dies 102a and 104a formed on the wafers 182 and 184, respectively, and FIG. 1C illustrates a top view of the dies 102a and 104a. Each of the dies 102a and 104a generally has an active side that includes a surface upon which a plurality of integrated circuit (IC) devices (not illustrated in the figures) such as transistors for logic and/or memory are formed, and an inactive side that is disposed opposite to the active side. In FIG. 1B, the active sides of the dies 102a and 104a are labeled as A1 and B1, respectively, while the inactive sides of the dies 102a and 104a are labeled as A2 and B2, respectively.

The surface of the die 102a on the active side of the die 102a is also referred to herein as an active surface of the die 102a, and the surface of the die 104a on the active side of the die 104a is also referred to herein as an active surface of the die 104a. In an example, the inactive side A2 of the die 102a is attached to the wafer 182, and the inactive side B2 of the die 104a is attached to the wafer 184. In an embodiment, the die 104a is smaller in size compared to the die 102a. For example, an area of the active surface of the die 104a is smaller than an area of the active surface of the die 102a, as illustrated in FIGS. 1B and 1C.

FIG. 1C illustrates the top view of the two dies 102a and 104a. The top view of FIG. 1C illustrates the active sides A1 and B1 of the dies 102a and 104a, respectively. As illustrated in FIGS. 1B and 1C, the die 102a comprises a plurality of bond pads 112, which are formed on the active side A1 of the die 102a (i.e., formed on the active surface of the die 102a). Individual ones of the bond pads 112 are electrically connected to one or more corresponding internal electrical components of the die 102a, and facilitates routing electric signals (e.g., input/output (I/O) signals, power signals, ground signals, etc.) to and/or from the die 102a.

In an embodiment, the bond pads 112 are arranged near a periphery of the die 102a. For example, as illustrated in FIG. 1C, the bond pads 112 are arranged along the four edges of the die 102a (although in another embodiment and not illustrated in the figures, the bond pads 112 can arranged along only one, two or three edges of the die 102a). FIG. 1C illustrates only one line or series of bond pads 112 along each edge of the die 102a. However, in another embodiment and although not illustrated in FIG. 1C, the bond pads 112 can be arranged in any other appropriate configuration near the periphery of the die 102. In an example, the bond pads 112 are arranged such that the bond pads do not occupy at least a central section of the active surface of the die 102a (e.g., such that there is enough space on the active surface of the die 102a to stack the die 104a thereon, as will be discussed in more detail herein later).

As illustrated in FIGS. 1B and 1C, the die 104a comprises a plurality of bond pads 114, which are formed on the active side B1 of the die 104a (i.e., formed on the active surface of the die 104a). Individual ones of the bond pads 114 are electrically connected to one or more corresponding internal electrical components of the die 114, and facilitates routing electric signals (e.g., input/output (I/O) signals, power signals, ground signals, etc.) to and/or from the die 104a.

In an embodiment, the bond pads 114 can be arranged at any position on the active surface of the die 104a. For example, FIG. 1C illustrates the bond pads 114 being randomly arranged (e.g., arranged without any specific pattern) on the active surface of the die 104a (e.g., some of the bond pads are arranged near the periphery, while some are arranged near a central section of the active surface of the die 104a). In another example and although not illustrated in the figures, the bond pads 114 are arranged solely along the periphery of the die 104a. In yet another example and although not illustrated in the figures, the bond pads 114 are arranged in any other appropriate pattern on the active surface of the die 104a. That is, unlike the bond pads 112 on the die 102a, the bond pads 114 on the die 104a need not necessarily be arranged only near the periphery of the die 104a.

In an embodiment, the bond pads 112, 114 are respectively formed on the dies 102a, 104a while the dies 102a, 104a are still attached to the wafers 182, 184, respectively. In an embodiment, the bond pads 112, 114 can be replaced by any other appropriate structure that provides input/output connection to the dies 102a, 104a, e.g., replaced by corresponding bump pads.

Figure 2:
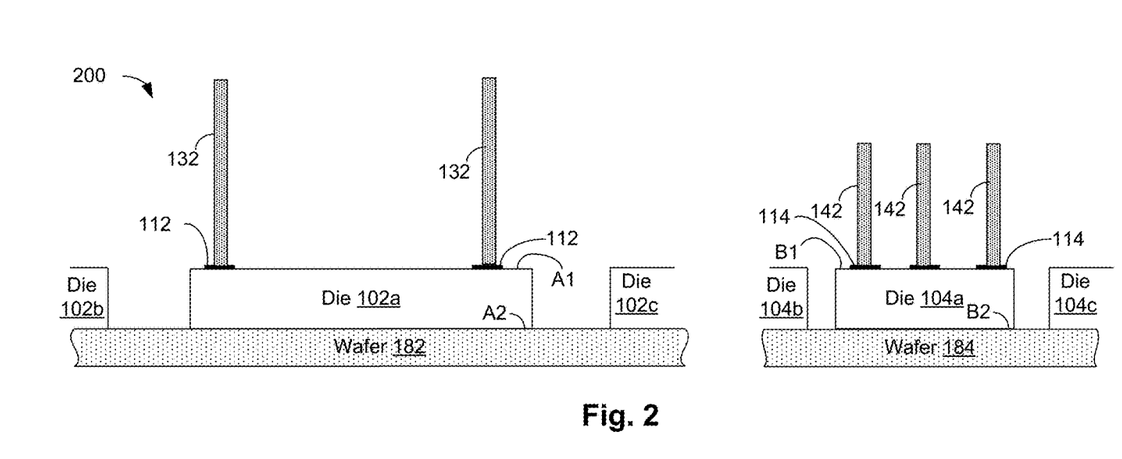

FIG. 2 illustrates an arrangement 200, in which metal posts 132, 142 are respectively formed on ones of the bond pads 112, 114 of the dies 102a, 104a, respectively, of the arrangement 100 of FIGS. 1A-1C. For example, each of the metal posts 132 is formed on a corresponding one of the bond pads 112 of the die 102a. For example, a bottom end of a metal post 132 is formed on, and makes electrical connection to a corresponding bond pad 112 of the die 102a. Similarly, each of the metal posts 142 is formed on a corresponding one of the bond pads 114 of the die 104a. For example, a bottom end of a metal post 142 is formed on, and makes electrical connection to a corresponding bond pad 114 of the die 104a.

In an embodiment, the metal posts 132, 142 are metal pillars formed from an appropriate metal or other conductive material. In an example, the metal posts 132, 142 comprise copper, while in another example, the metal posts 132, 142 comprise aluminum or another appropriate metal.

In an embodiment, all the metal posts of the metal posts 132 are substantially similar in height, and all the metal posts of the metal posts 142 are substantially similar in height. In an embodiment, the height of the metal posts 132 is smaller than the height of the metal posts 142. As illustrated in FIG. 2, in an embodiment, the metal posts 132, 142 are formed on the dies 102a, 104a, while the dies 102a, 104a are still attached to the corresponding wafers 182, 184.

Figure 3:
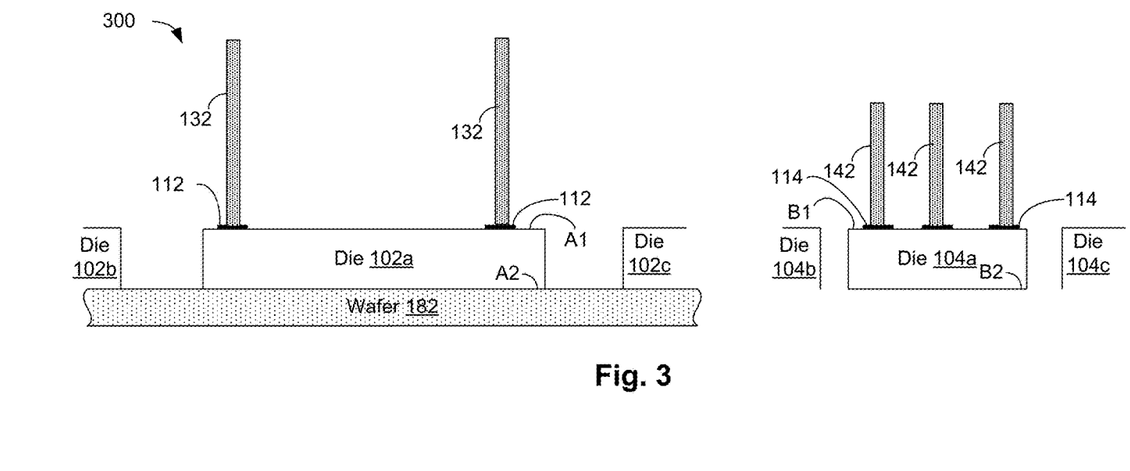

FIG. 3 illustrates an arrangement 300, in which the wafer 184 of the arrangement 200 of FIG. 2 is singulated such that the die 104a is separated from the other dies 104b, 104c, . . . , 104M of the wafer 184. For example, the wafer 184 is at least partially grinded or otherwise thinned (e.g., so that a thickness of the wafer 184 decreases, not illustrated in the figures), and then the wafer 184 is singulated, such that the die 104a is separated from the other dies of the wafer 184. In an embodiment, subsequent to grinding the wafer 184 and singulating the die 104a, a thin layer of the wafer 184 may still be attached to the inactive side B2 of the die 104a, although such a thin layer of the wafer 184 is not illustrated in FIG. 3. In another embodiment, the wafer 184 is substantially completely removed from the inactive side B2 of the die 104a, as illustrated in FIG. 3.

Figure 4A:
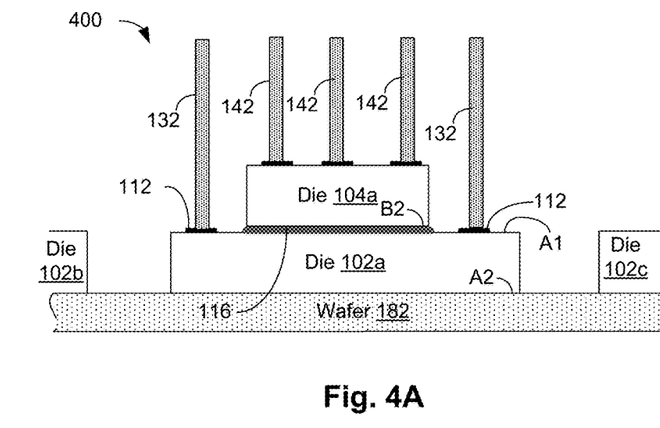
Figure 4B:
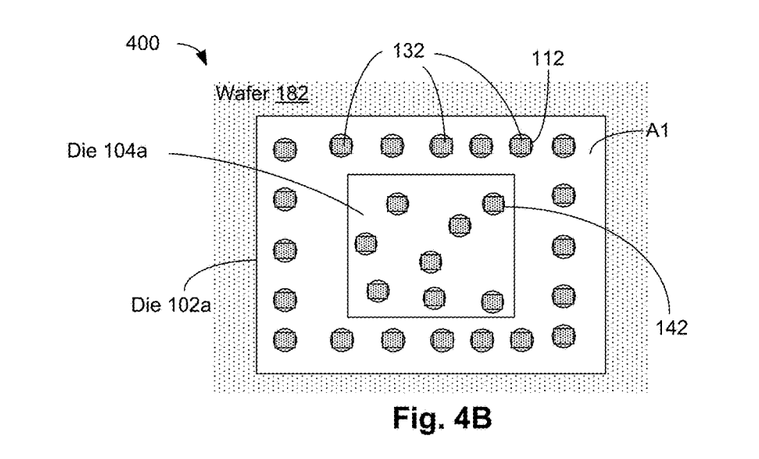

FIGS. 4A and 4B illustrate an arrangement 400, in which the singulated die 104a of the arrangement 300 of FIG. 3 is placed on the die 102a. FIG. 4A illustrates a side view of the arrangement 400, and 4B illustrates a top view of the arrangement 400. In the arrangement 400, the die 104a is stacked on the die 102a. For example, the inactive side B2 of the die 104a is attached to the active side A1 of the die 102a. The die 104a is attached to the die 102a using, for example, an appropriate die attach material 116 (e.g., adhesive, paste, and/or another appropriate die attach material).

As discussed herein earlier, the metal posts 132 on the bond pads 112 of the die 102a are arranged such that the metal posts 132 do not occupy a section (e.g., a central section) of the active surface of the die 102a. In an embodiment, the die 104a is placed on the section of the active surface of the die 102a that is not occupied by any of the metal posts 132. Thus, for example, the die 104a is stacked on a central section of the active surface of the die 102a, while the metal posts 132 and the bond pads 112 are arranged near the periphery of the die 102a.

In an embodiment, the stacking of the die 104a on the die 102a is performed while the die 102a is still attached to the wafer 182. In an embodiment, the heights of the metal posts 132, 142 in the arrangement 200 of FIG. 2 are selected such that once the die 104a is stacked on the die 102a in the arrangement 400 of FIGS. 4A and 4B, the top ends of the metal posts 132, 142 substantially lie in the same (or near same) plane.

Figure 5:
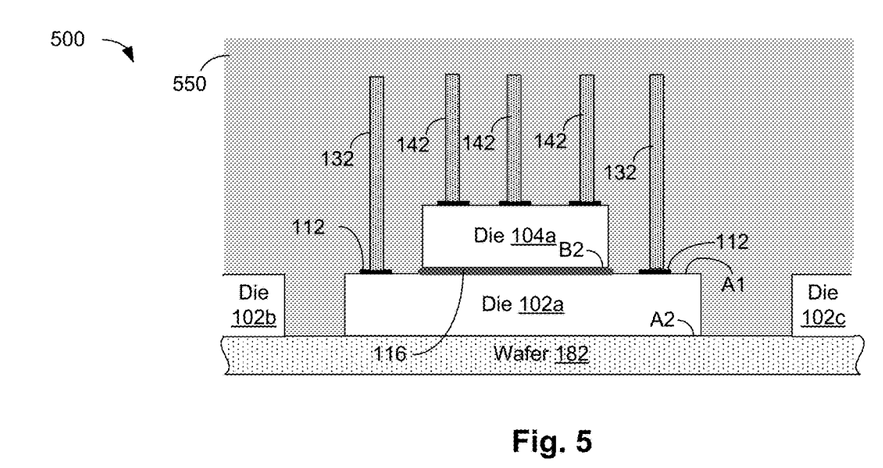

FIG. 5 illustrates an arrangement 500, in which a molding compound 550 is formed on several components of the arrangement 400 of FIGS. 4A and 4B. The molding compound 550 comprises any appropriate molding compound material, e.g., epoxy, resins, etc. In an embodiment, the molding compound 550 is deposited over the wafer 182, and substantially encapsulates the metal posts 132, 142, the bond pads 132, 142, and the dies 102, 104, as illustrated in FIG. 5.

Figure 6:
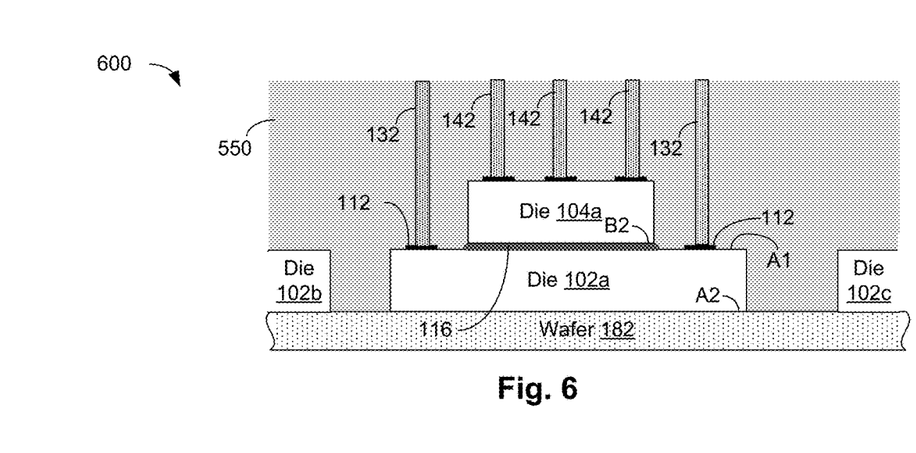

FIG. 6 illustrates an arrangement 600, in which the molding compound 550 is at least in part removed from the arrangement 500 of FIG. 5. For example, a top surface of the molding compound 550 is grinded or otherwise removed such that the top end of the metal posts 132, 142 are exposed through the top surface of the molding compound 550. In an embodiment, at least a part of the top ends of the metal posts 132, 142 are also removed along with removing the top surface of the molding compound 550, such that the top ends of the metal posts 132, 142 are substantially flush or are at the same plane with the top surface of the molding compound 550 (e.g., such that the top ends of the metal posts 132, 142 are exposed through the molding compound 550).

Figure 7:
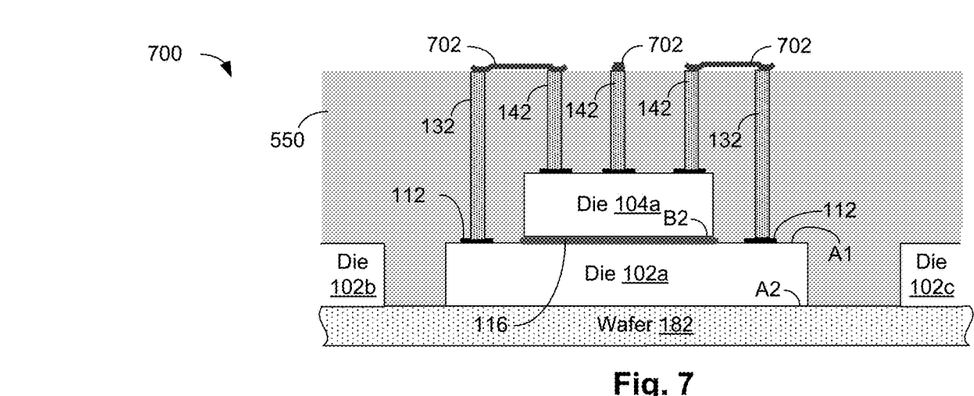

FIG. 7 illustrates an arrangement 700, in which one or more redistribution layers 702 are formed on the arrangement 600 of FIG. 6. For example, a redistribution layer 702 electrically connects a top end of a metal post 132 to a top end of a corresponding metal post 142. Thus, the one or more redistribution layers 702 routes signals between the metal posts 132 and metal posts 142, thereby routing signals between the dies 102a and 104a.

The one or more redistribution layers 702 can be formed, for example, by depositing and/or patterning an electrically conductive material such as, for example, a metal (e.g., copper or aluminum) or a doped semiconductor material (e.g., doped polysilicon) on the top surface of the molding compound 550. Other suitable electrically conductive materials can be used to form the one or more redistribution layers 702 in other embodiments.

The one or more redistribution layers 702 can include a variety of structures to route electrical signals such as, pads, lands, traces, and/or the like. FIG. 7 illustrates a single layer of the redistribution layers 702, although in another embodiment (and not illustrated in FIG. 7), more than one layer (e.g., two layers, three layers, etc.) of redistribution layers can also be used.

Figure 8:
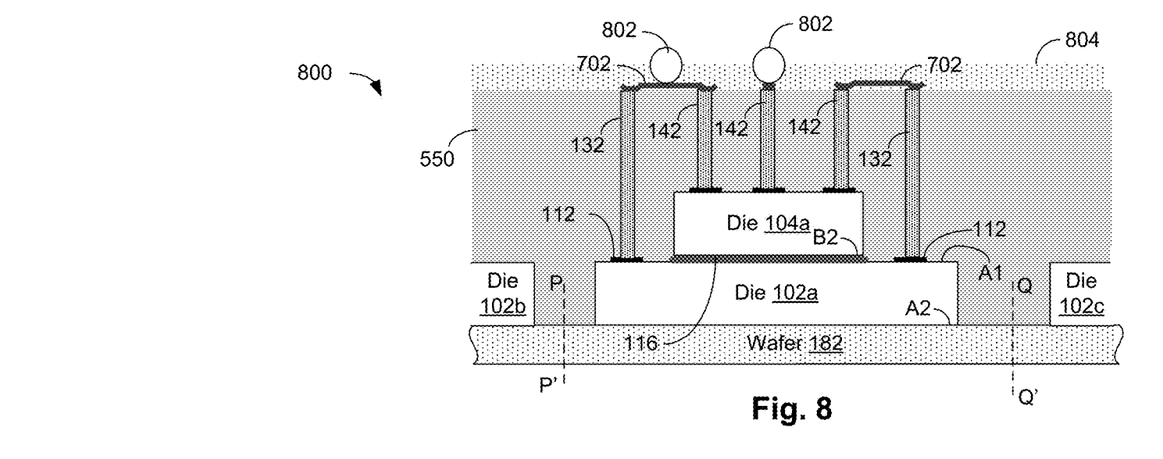

FIG. 8 illustrates an arrangement 800, in which a passivation layer 804 comprising an electrically insulative material such as polyimide, for example, is deposited on the redistribution layers 702 of the arrangement 700 of FIG. 7. In an embodiment, the passivation layer 804 is patterned to provide openings in the passivation layer 804. In an example, the openings are formed over one or more of the redistribution layers 702. One or more package interconnect structures 802 are placed in the openings.

The package interconnect structures 802 generally comprise an electrically conductive material. The package interconnect structures 802 can be formed in a variety of shapes including spherical, planar, or polygon shapes, and can be positioned in a variety of positions including in a row or in an array of multiple rows. In an example, the package interconnect structures 802 comprise solder balls, metal posts, bumps, and/or the like.

In an embodiment, ones of the package interconnect structures 802 is attached to a corresponding one of the redistribution layers 702. The package interconnect structures 802 allow the dies 102a, 104a to route external signals (e.g., signals to and/or from another semiconductor package, a printed circuit board, etc., not illustrated in FIG. 8) to and/or from the dies 102a, 104a, e.g., via the bond pads 112, 114, the metal posts 132, 142, and the redistribution layers 702. The arrangement 800 forms a package assembly that is formed on the wafer 182. In an example, the package assembly of the arrangement 800 is a wafer level packaging.

Figure 9A:
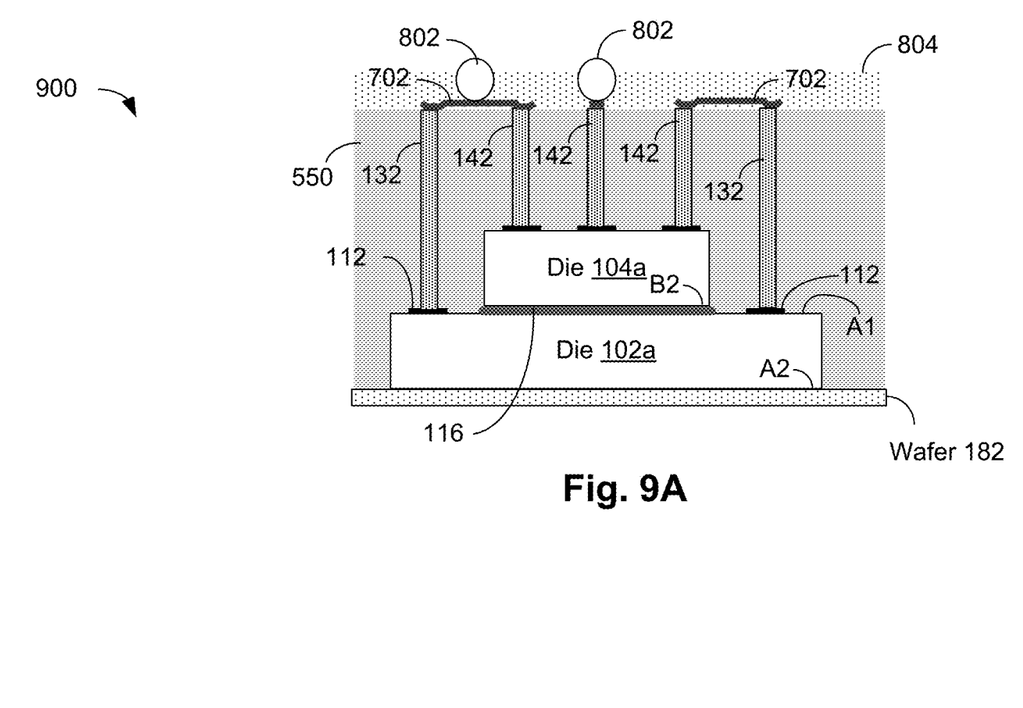

FIG. 9A illustrates an arrangement 900, in which the wafer 182 is singulated such that the die 102a is separated from the other dies on the wafer 182. For example, the wafer 182 is singulated along the lines PP' and QQ' in FIG. 8. In an embodiment, the wafer 182 is at least partially removed prior to the singulation. For example, the wafer 182 is grinded to reduce a thickness of the wafer 182, prior to the singulation of the wafer 182. Accordingly, a thickness of the wafer 182 in the arrangement 900 of FIG. 9A is less than that in the arrangement 800 of FIG. 8. The arrangement 900, for example, forms a package assembly, e.g., a chip-scale package (CSP) assembly, in which the two stacked dies 102a, 104a are interconnected to each other (and also connected to external components) via the metal posts 132, 142. The package assembly of FIG. 9A can be connected to another component (e.g., an electronic device, a printed circuit board, another package assembly, etc.) via the package interconnect structures 802.

FIGS. 1A-9A are directed to the die 104a being stacked on the die 102a. However, in another embodiment, more than two dies can be stacked on top of each other (e.g., one or more dies can be stacked on top of the die 104a to form three layers of stacked dies). In such an embodiment, the multiple layers of stacked dies can be interconnected using metal posts (e.g., which are similar to the metal posts 132, 142), as would be readily understood by those skilled in the art based on the teachings of this disclosure.

Figure 9B:
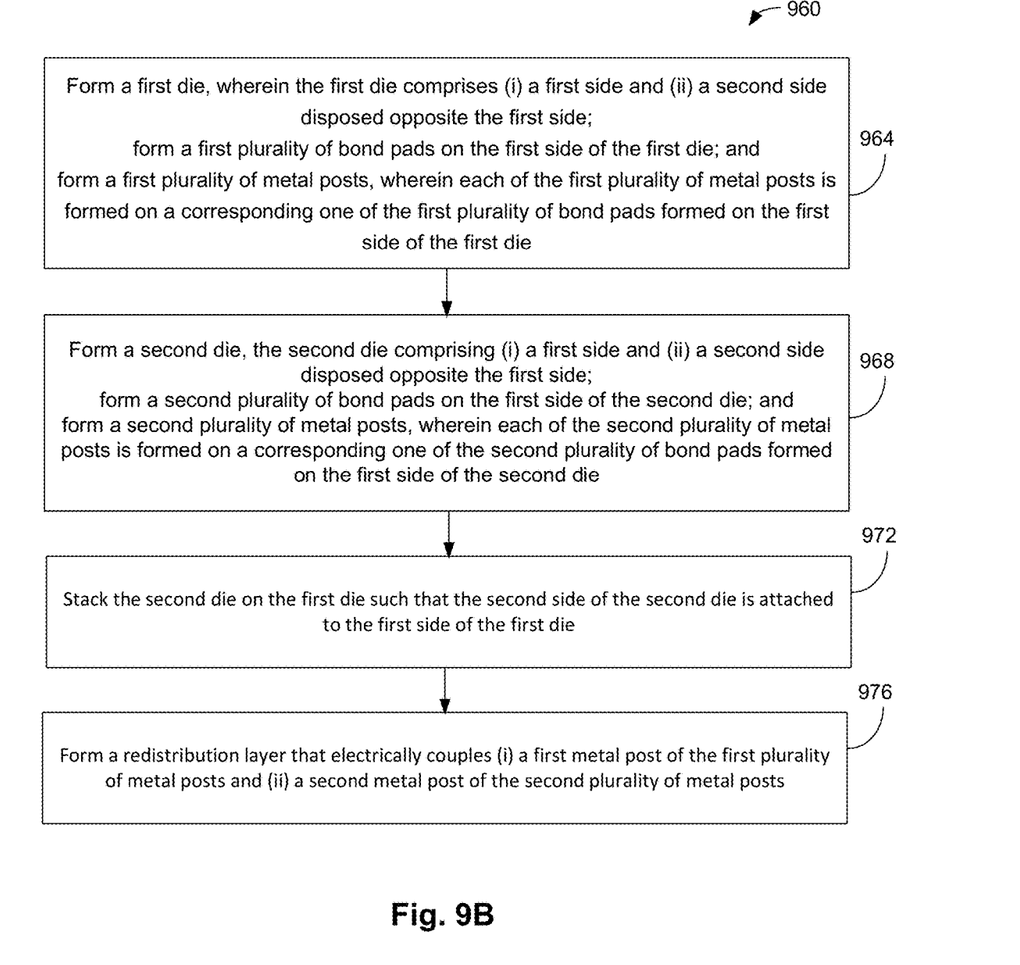
FIG. 9B illustrates a flow diagram of an example method for forming the semiconductor package assembly of FIGS. 1A-9A.

FIG. 9B illustrates a flow diagram of an example method 960 for forming the semiconductor package assembly of FIGS. 1A-9A. At 964, a first die (e.g., die 102a of FIGS. 1A-9A) is formed (e.g., formed on the wafer 182). In an example, the first die comprises (i) a first side (e.g., the active side A1) and (ii) a second side (e.g., the inactive side A2) disposed opposite the first side. Also at 964, a first plurality of bond pads (e.g., bond pads 112) is formed on the first side of the first die. Also at 964, a first plurality of metal posts (e.g., metal posts 132) is formed on the first die. In an example, each of the first plurality of metal posts is formed on a corresponding one of the first plurality of bond pads formed on the first side of the first die.

At 968, a second die (e.g., die 104*a*) is formed (e.g., formed on the wafer 184). In an example, the second die comprises (i) a first side (e.g., the active side B1) and (ii) a second side (e.g., the inactive side B2) disposed opposite the first side. Also at 968, a second plurality of bond pads (e.g., bond pads 114) is formed on the first side of the second die. Also at 968, a second plurality of metal posts (e.g., metal posts 142) is formed on the second die. In an example, each of the second plurality of metal posts is formed on a corresponding one of the second plurality of bond pads formed on the first side of the second die.

At 972, the second die is stacked on the first die such that the second side of the second die is attached to the first side of the first die, e.g., as illustrated in FIGS. 4A and 4B. At 976, a redistribution layer (e.g., one of the redistribution layers 702 of FIGS. 7 and 8) is formed. In an example, the redistribution layer electrically couples (i) a first metal post of the first plurality of metal posts and (ii) a second metal post of the second plurality of metal posts. In an example, the first die, the second die, the first and second plurality of metal posts, and the redistribution layer form a semiconductor package assembly. In an example, the first die communicates with the second die via at least the first metal post, the redistribution layer, and the second metal post.

In FIGS. 1A-9A, the bond pads 112 (and the metal posts 132) are disposed near a periphery of the die 102*a*, but not disposed on a central section of the die 102*a*. However, in another embodiment, it may be desired to dispose the bond pads even in a central section of a die, on which another die is stacked.

Figure 10A:
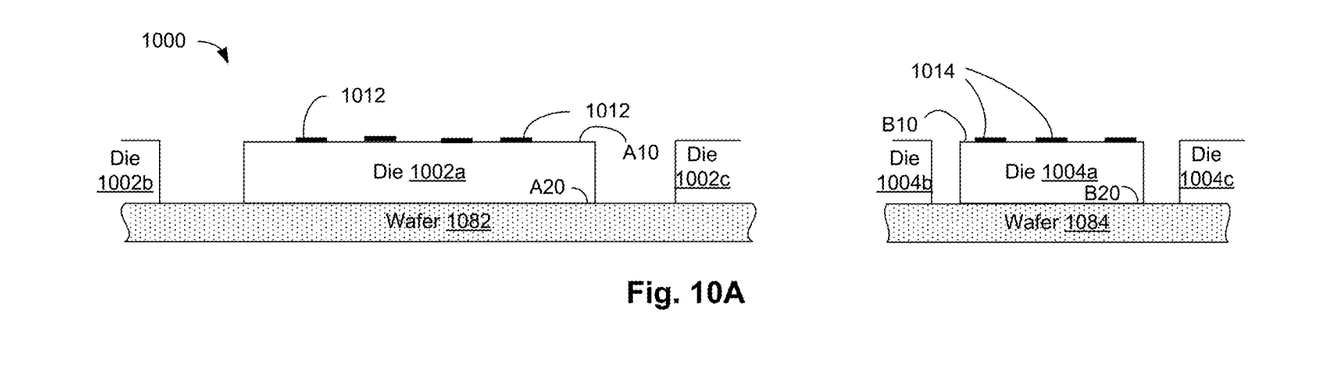

FIGS. 10A-14 illustrate formation a package assembly comprising a die 1004*a* stacked on a die 1002*a*, where the die 1002*a* comprises bond pads disposed even in a central section of an active surface of the die 1002*a*. Referring to FIG. 10*a*, this figure illustrates an arrangement 1000 in which the die 1002*a* is formed on a wafer 1082, and the die 1004*a* is formed on a wafer 1084. The wafers 1082, 1084 are substantially similar to the wafers 182, 184 of FIG. 1A, and hence, the wafers 1082, 1084 (and various dies formed on these wafers) are not discussed in further detail herein.

Figure 10B:
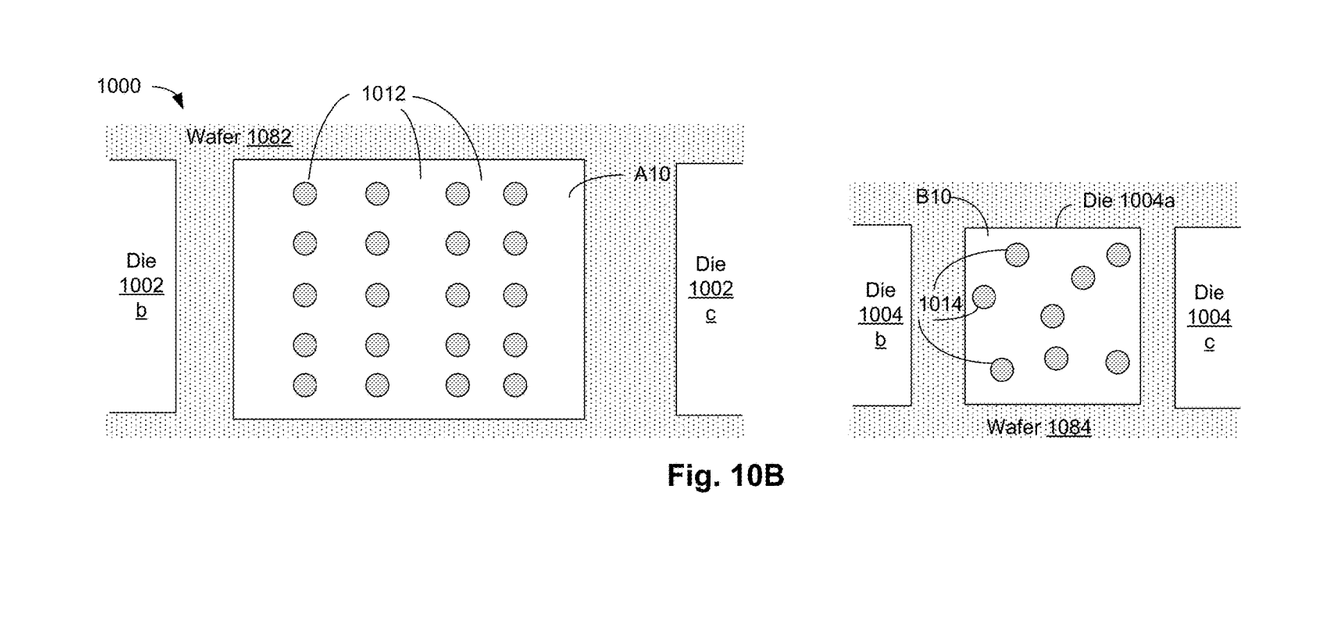

FIG. 10B illustrates a top view of the dies 1002*a* and 1004*a*. Similar to dies 102*a*, 104*a* of FIGS. 1A and 1B, the dies 1002*a*, 1004*a* of FIGS. 10A and 10B has bond pads 1012, 1014 disposed throughout an active surface of the dies 1002*a*, 1004*a*, respectively. However, unlike the die 102*a* of FIGS. 1A and 1B (in which no bond pads were disposed in the central section of the die 102*a*), the die 1002*a* of FIGS. 10A and 10B has bond pads 1012 disposed throughout an active surface of the die 1002*a*. For example, some of the bond pads 1012 are disposed on a central section of the die 1002*a*, while some of the bond pads 1012 are disposed near the periphery of the die 1002*a*.

Figure 11:
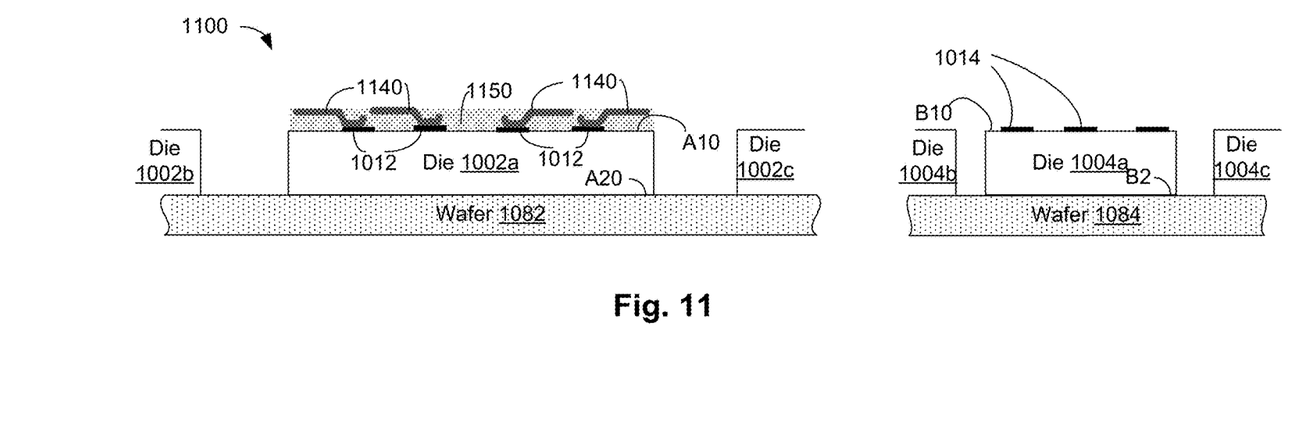

FIG. 11 illustrates an arrangement 1100, in which one or more redistribution layers 1140 are formed on the die 1002*a*. For example, each of the redistribution layers 1140 has a first end attached to a corresponding one of the bond pads 1012, and a second end that is disposed near a periphery of the die 1002*a*. That is, none of the second ends of the redistribution layers 1140 is disposed on a central section of the die 1002*a* (although the central section of the die 1002*a* has at least some of the bond pads 1012 disposed thereon). The one or more redistribution layers 1140 can be formed, for example, by depositing and/or patterning an electrically conductive material such as, for example, a metal (e.g., copper or aluminum) or a doped semiconductor material (e.g., doped polysilicon) on the active surface of the die 1002*a*. Other suitable electrically conductive materials can be used to form the one or more redistribution layers 1140 in other embodiments.

FIG. 11 also illustrates a passivation layer 1150 comprising an electrically insulative material (such as polyimide, for example) being deposited on the redistribution layers 1140. In an embodiment, the passivation layer 1150 is patterned to provide openings in the passivation layer. In an example, the openings are formed over the above discussed second ends of the redistribution layers 1140. Thus, the passivation layer 1150 encapsulates the bond pads 1012 and the first ends of the redistribution layers 1140 (e.g., where the first end of a redistribution layer 1140 is the end that is attached to a corresponding bond pad 1012), while the passivation layer 1150 exposes the second ends of the redistribution layers 1140 (e.g., where the second end of a redistribution layer 1140 is opposite to the first end of the redistribution layer 1140).

Figure 12:
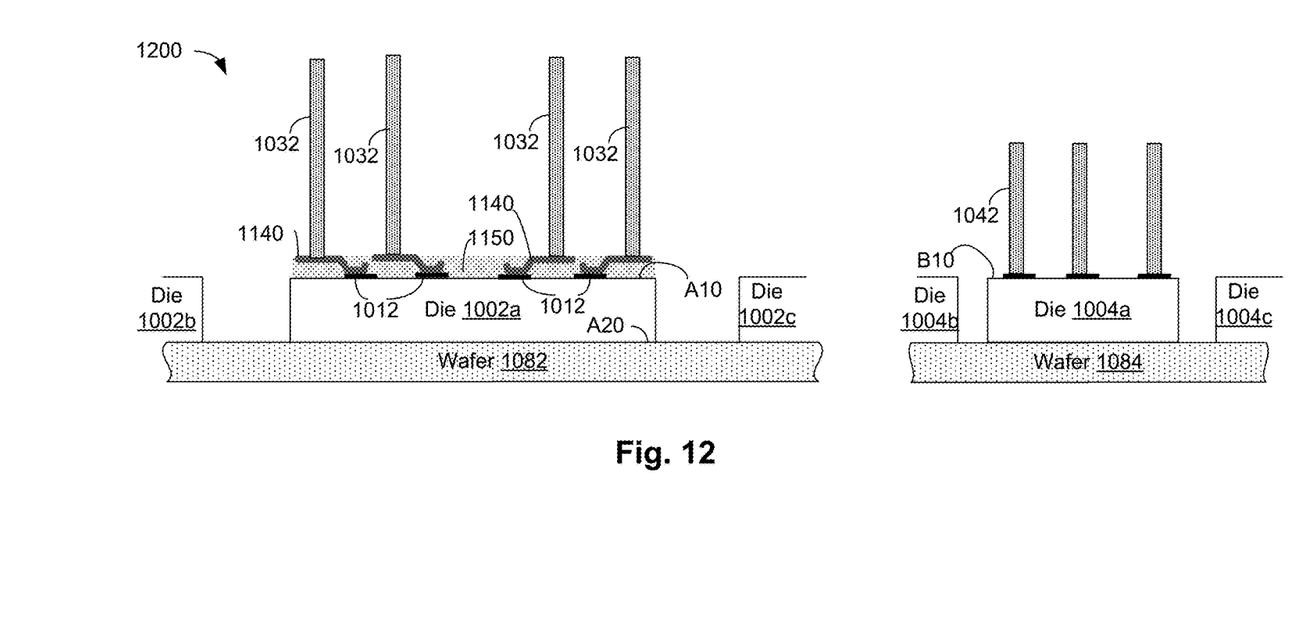

FIG. 12 illustrates an arrangement 1200, in which metal posts 1032 are formed on the second ends of the redistribution layers 1140 of the die 1002*a*, and metal posts 1042 are formed on the bond pads 1014 the die 1004*a*. As the second ends of the redistribution layers 1140 are not disposed in the central section of the active surface of the die 1002*a*, the metal posts 1032 are also not disposed in the central section of the active surface of the die 1002*a*. The metal posts 1032, for example, are disposed along or near the periphery of the active surface of the die 1002*a*. Metal posts have been previously discussed herein in detail, and accordingly, a more detailed description of the metal posts 1032, 1042 is omitted herein.

Although not illustrated in the figures (and as discussed with respect to FIG. 3), the wafer 1084 in the arrangement 1200 is singulated such that the die 1004*a* is separated from other dies in the wafer 1084. As also discussed with respect to FIG. 3, the wafer 1084 is grinded to at least partially or completely remove the wafer 1084 from the inactive side of the die 1004*a*.

Figure 13:
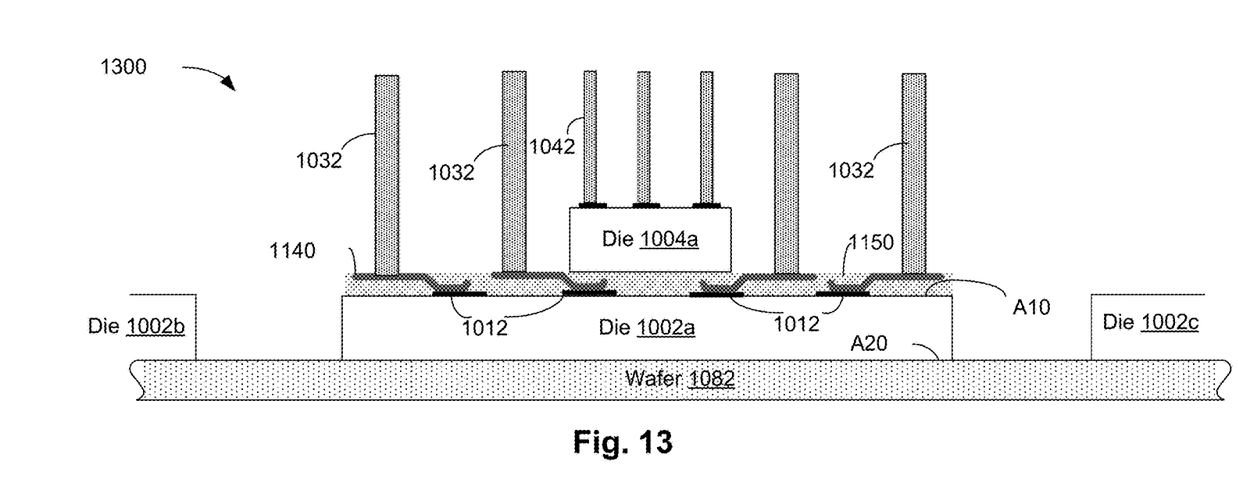
Figure 14:
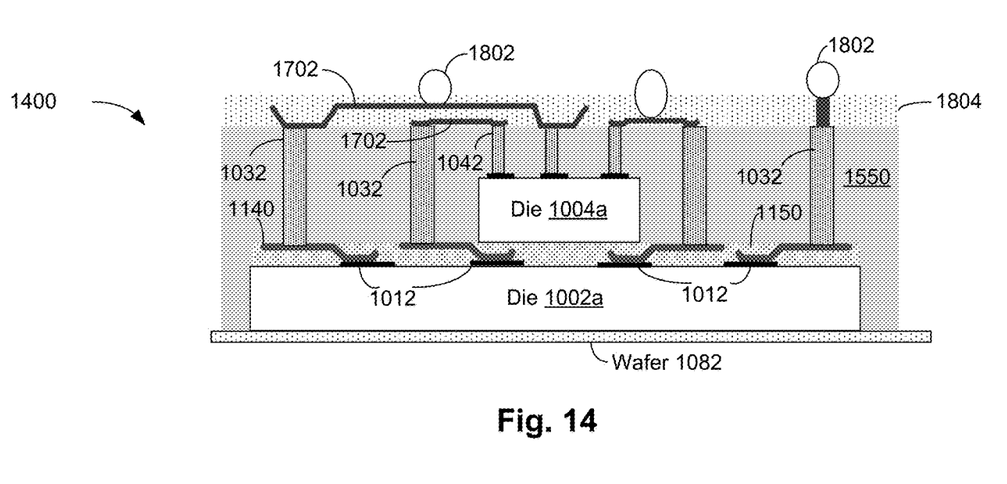

As illustrated in FIG. 13, in an arrangement 1300, the die 1004*a* is then stacked on the die 1002*a*, as discussed with respect to FIGS. 4A and 4B previously herein. Although the not illustrated in the figures, the arrangement 1300 is then processed in a manner that is at least in part similar to the processing discussed with respect to FIGS. 5-9A. As illustrated in FIG. 14, such processing involves, for example, encapsulating the arrangement 1300 by a molding compound 1550, grinding the molding compound 1550 to expose the top ends of the metal posts 1032, 1042, forming redistribution layers 1072 on the top surface of the molding compound 1550, depositing passivation layer 1804 on the redistribution layers 1702, forming openings in the passivation layer 1804, forming package interconnect structures 1802 in the openings of the passivation layer 1804, singulating the wafer 1082 to separate the die 1002*a* from other dies of the wafer 1082, and reducing a thickness of the wafer 1082. Such processing has been discussed in detail herein earlier, and will not be repeated for the sake of brevity. Such processing results in a final package assembly 1400, as illustrated in FIG. 14.

In an example, various operations discussed herein above can be appropriately modified. For example, FIGS. 12 and 13 illustrate forming metal posts on the dies 1002*a*, 1004*a*, and subsequently stacking the die 1004*a* on the die 1002*a*. However, in another embodiment, the operations described with respect to FIG. 12 can be bypassed. For example, subsequent to the arrangement 1100 of FIG. 11, the die 1004*a* can be stacked on the die 1002*a* (e.g., prior to forming any metal posts on the dies 1004*a*, 1002*a*, not illustrated in the figures). Subsequent to stacking the die 1004*a* on the die 1002*a*, the metal posts 1032 can be formed on the second ends of the redistribution layers 1140 of the die 1002*a*, and the metal posts 1042 can be formed on the bond pads 1014 the die 1004*a*, thereby resulting in the arrangement 1300 of FIG. 13.

The arrangement 1400, for example, forms a package assembly, e.g., a chip-scale package (CSP) assembly, in which the two stacked dies 1002*a*, 1004*a* are interconnected to each other (and also connected to external components) via the metal posts 1032, 1042. The redistribution layers 1140 allow one or more of the bond pads 1012 to be formed even on a central section of the die 1002*a*, as discussed herein earlier. The package assembly of FIG. 14 can be connected to another component (e.g., an electronic device, a printed circuit board, another package assembly, etc.) via the package interconnect structures 1802.

Further aspects of the present invention relate to one or more of the following clauses. In an example, a semiconductor package comprises a first die having (i) a first side and (ii) a second side disposed opposite the first side of the first die, wherein the first die comprises a first plurality of bond pads formed on the first side of the first die; a second die having (i) a first side and (ii) a second side disposed opposite the first side of the second die, wherein the second die comprises a second plurality of bond pads formed on the first side of the second die, wherein the second die is stacked on the first die such that the second side of the second die is attached to the first side of the first die; a first plurality of metal posts, wherein each of the first plurality of metal posts is formed on a corresponding one of the first plurality of bond pads formed on the first side of the first die; a second plurality of metal posts, wherein each of the second plurality of metal posts is formed on a corresponding one of the second plurality of bond pads formed on the first side of the second die; and a redistribution layer configured to electrically couple (i) a first metal post of the first plurality of metal posts and (ii) a second metal post of the second plurality of metal posts. In an example, each of the first plurality of metal posts comprises (i) a first end that is attached to the corresponding one of the first plurality of bond pads formed on the first side of the first die and (ii) a second end that is opposite the first end; each of the second plurality of metal posts comprises (i) a first end that is attached to the corresponding one of the second plurality of bond pads formed on the first side of the second die and (ii) a second end that is opposite the first end; and the redistribution layer is configured to electrically couple (i) a second end of the first metal post of the first plurality of metal posts and (ii) a second end of the second metal post of the second plurality of metal posts. In an example, the semiconductor package further comprises a substrate, wherein the second side of the first die is attached to the substrate. In an example, the semiconductor package further comprises a molding compound that substantially surrounds the first plurality of metal posts and the second plurality of metal posts. In an example, the semiconductor package further comprises die attach material, wherein the second side of the second die is attached to the first side of the first die via the die attach material. In an example, the semiconductor package further comprises a package interconnect structure formed on the redistribution layer, wherein the package interconnect structure is configured to route signals between (i) the semiconductor package and (ii) a component that is external to the semiconductor package. In an example, the first plurality of bond pads are formed near a periphery of the first side of the first die; and the second die is stacked on the first die such that the second side of the second die is attached to a central section of the first side of the first die. In an example, the second die is stacked on the first die such that the second side of the second die is attached to a first section of the first side of the first die; and no bond pad of the first plurality of bond pads is formed on the first section of the first side of the first die.

In an example, a method of forming a semiconductor package comprises forming a first die, the first die comprising (i) a first side and (ii) a second side disposed opposite the first side of the first die; forming a first plurality of bond pads on the first side of the first die; forming a second die, the second die comprising (i) a first side and (ii) a second side disposed opposite the first side of the second die; forming a second plurality of bond pads on the first side of the second die; forming a first plurality of metal posts, wherein each of the first plurality of metal posts is formed on a corresponding one of the first plurality of bond pads formed on the first side of the first die; forming a second plurality of metal posts, wherein each of the second plurality of metal posts is formed on a corresponding one of the second plurality of bond pads formed on the first side of the second die; subsequent to forming the first plurality of metal posts and the second plurality of metal posts, stacking the second die on the first die such that the second side of the second die is attached to the first side of the first die; and forming a redistribution layer that electrically couples (i) a first metal post of the first plurality of metal posts and (ii) a second metal post of the second plurality of metal posts. In an example, each of the first plurality of metal posts comprises (i) a first end that is attached to the corresponding one of the first plurality of bond pads formed on the first side of the first die and (ii) a second end that is opposite the first end, wherein each of the second plurality of metal posts comprises (i) a first end that is attached to the corresponding one of the second plurality of bond pads formed on the first side of the second die and (ii) a second end that is opposite the first end, and wherein forming the redistribution layer comprises: forming the redistribution layer such that the redistribution layer is attached to (i) a second end of the first metal post of the first plurality of metal posts and (ii) a second end of the second metal post of the second plurality of metal posts. In an example, forming the first die comprises forming a first plurality of dies on a first wafer, the first plurality of dies including the first die; forming the second die comprises forming a second plurality of dies on a second wafer, the second plurality of dies including the second die; the second side of the first die is attached to the first wafer and the second side of the second die is attached to the second wafer; forming the first plurality of metal posts comprises while the first die is attached to the first wafer, forming the first plurality of metal posts on the first die; and forming the second plurality of metal posts comprises while the second die is attached to the second wafer, forming the second plurality of metal posts on the second die. In an example, the method further comprises subsequent to forming the second plurality of metal posts and prior to stacking the second die on the first die, removing the second die from the second wafer, wherein while the first die is attached to the first wafer, the second die is stacked on the first die. In an example, the method further comprises forming a molding compound that substantially surrounds the first plurality of metal posts and the second plurality of metal posts. In an example, stacking the second die on the first die comprises: stacking the second die on the first die such that the second side of the second die is attached to the first side of the first die via die attach material. In an example, the method further comprises forming a package interconnect structure on the redistribution layer; routing signals, via the package interconnect structure, between (i) the semiconductor package comprising the first die and the second die, and (ii) a component that is external to the semiconductor package. In an example, forming the first plurality of bond pads on the first side of the first die comprises forming the first plurality of bond pads near a periphery of the first side of the first die; and stacking the second die on the first die comprises stacking the second die on the first die such that the second side of the second die is attached to a central section of the first side of the first die. In an example, stacking the second die on the first die comprises stacking the second die on the first die such that the second side of the second die is attached to a first section of the first side of the first die; and no bond pad of the first plurality of bond pads is formed on the first section of the first side of the first die.

In an example, a semiconductor package comprises a first die having (i) a first side and (ii) a second side disposed opposite the first side of the first die, wherein the first die comprises a first bond pad formed on the first side of the first die; a second die having (i) a first side and (ii) a second side disposed opposite the first side of the second die, wherein the second die comprises a second bond pad formed on the first side of the second die, wherein the second die is stacked on the first die such that the second side of the second die faces the first side of the first die; a first redistribution layer formed on the first side of the first die, wherein the first redistribution layer comprises (i) a first end attached to the first bond pad, and (ii) a second end that is opposite to the first end; a first metal post formed on the second end of the first redistribution layer; a second metal post formed on the second bond pad that is formed on the first side of the second die; and a second redistribution layer configured to electrically couple (i) the first metal post and (ii) the second metal post. In an example, the semiconductor package further comprises a passivation layer formed on the first side of the first die, wherein the passivation layer at least in part covers the first bond pad formed on the first side of the first die, wherein the second die is stacked on the first die such that the second side of the second die is over a section of the passivation layer that covers the first bond pad. In an example, the semiconductor package further comprises a molding compound that substantially surrounds the first metal post and the second metal post.

The description may use the phrases "in an embodiment," or "in embodiments," which may each refer to one or more of the same or different embodiments. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Although certain embodiments have been illustrated and described herein, a wide variety of alternate and/or equivalent embodiments or implementations calculated to achieve the same purposes may be substituted for the embodiments illustrated and described without departing from the scope of the present invention. This application is intended to cover any adaptations or variations of the embodiments discussed herein. Therefore, it is manifestly intended that embodiments in accordance with the present invention be limited only by the claims and the equivalents thereof.

What is claimed is:

1. A method of forming a semiconductor package, the method comprising:
    forming a first die, the first die comprising (i) a first side and (ii) a second side disposed opposite the first side of the first die;
    forming a first plurality of bond pads on the first side of the first die;
    forming a second die, the second die comprising (i) a first side and (ii) a second side disposed opposite the first side of the second die;
    forming a second plurality of bond pads on the first side of the second die;
    forming a first plurality of metal posts, wherein each of the first plurality of metal posts is formed on a corresponding one of the first plurality of bond pads formed on the first side of the first die;
    forming a second plurality of metal posts, wherein each of the second plurality of metal posts is formed on a corresponding one of the second plurality of bond pads formed on the first side of the second die;
    subsequent to forming the first plurality of metal posts and the second plurality of metal posts, stacking the second die on the first die such that the second side of the second die is attached to the first side of the first die; and
    forming a redistribution layer that electrically couples (i) a first metal post of the first plurality of metal posts and (ii) a second metal post of the second plurality of metal posts,
    wherein forming the first die comprises
        forming a first plurality of dies on a first wafer, the first plurality of dies including the first die,
    wherein forming the second die comprises
        forming a second plurality of dies on a second wafer, the second plurality of dies including the second die,
    wherein the second side of the first die is attached to the first wafer and the second side of the second die is attached to the second wafer,
    wherein forming the first plurality of metal posts comprises
        while the first die is attached to the first wafer, forming the first plurality of metal posts on the first die, and
    wherein forming the second plurality of metal posts comprises
        while the second die is attached to the second wafer, forming the second plurality of metal posts on the second die.

2. The method of claim 1, wherein each of the first plurality of metal posts comprises (i) a first end that is attached to the corresponding one of the first plurality of bond pads formed on the first side of the first die and (ii) a second end that is opposite the first end, wherein each of the second plurality of metal posts comprises (i) a first end that is attached to the corresponding one of the second plurality of bond pads formed on the first side of the second die and (ii) a second end that is opposite the first end, and wherein forming the redistribution layer comprises:
    forming the redistribution layer such that the redistribution layer is attached to (i) a second end of the first metal post of the first plurality of metal posts and (ii) a second end of the second metal post of the second plurality of metal posts.

3. The method of claim 1, further comprising:
    subsequent to forming the second plurality of metal posts and prior to stacking the second die on the first die, removing the second die from the second wafer, wherein while the first die is attached to the first wafer, the second die is stacked on the first die.

4. The method of claim 1, further comprising:
forming a molding compound that substantially surrounds the first plurality of metal posts and the second plurality of metal posts.

5. The method of claim 1, wherein stacking the second die on the first die comprises:
stacking the second die on the first die such that the second side of the second die is attached to the first side of the first die via die attach material.

6. The method of claim 1, further comprising:
forming a package interconnect structure on the redistribution layer;
routing signals, via the package interconnect structure, between (i) the semiconductor package comprising the first die and the second die, and (ii) a component that is external to the semiconductor package.

7. The method of claim 1, wherein:
forming the first plurality of bond pads on the first side of the first die comprises
forming the first plurality of bond pads near a periphery of the first side of the first die; and
stacking the second die on the first die comprises
stacking the second die on the first die such that the second side of the second die is attached to a central section of the first side of the first die.

8. The method of claim 1, wherein:
stacking the second die on the first die comprises
stacking the second die on the first die such that the second side of the second die is attached to a first section of the first side of the first die; and
no bond pad of the first plurality of bond pads is formed on the first section of the first side of the first die.

* * * * *